US006833839B2

(12) United States Patent
Nair et al.

(10) Patent No.: US 6,833,839 B2
(45) Date of Patent: Dec. 21, 2004

(54) APPARATUS AND METHOD FOR MULTI-RESOLUTION COLOR MAPPING FOR DISPLAY DEVICES

(75) Inventors: Hari Nair, Bangalore (IN); Neha Agrawal, Bangalore (IN); Saif Choudhary, Bangalore (IN); Shashi Kumar, Bangalore (IN); Arun Johary, San Jose, CA (US)

(73) Assignee: Genesis Microchip Inc., Alviso, CA (US)

( * ) Notice: Subject to any disclaimer, the term of this patent is extended or adjusted under 35 U.S.C. 154(b) by 48 days.

(21) Appl. No.: 10/146,257

(22) Filed: May 13, 2002

(65) Prior Publication Data

US 2004/0036696 A1 Feb. 26, 2004

(51) Int. Cl.[7] .......................... G09G 5/00; G03F 1/46; G06K 9/00

(52) U.S. Cl. ...................... 345/602; 345/589; 345/600; 345/543; 358/518; 382/162; 382/167

(58) Field of Search ............................... 345/589–591, 345/600–605, 610, 536, 555, 531, 597, 543–544; 382/162, 164, 165, 167; 358/518–520, 523–525, 2.1

(56) References Cited

U.S. PATENT DOCUMENTS

| | | | | | |
|---|---|---|---|---|---|
| 4,914,437 | A | * | 4/1990 | Kibrick et al. | 341/3 |
| 5,325,522 | A | * | 6/1994 | Vaughn | 707/1 |
| 6,026,179 | A | * | 2/2000 | Brett | 382/162 |
| 6,320,676 | B1 | * | 11/2001 | Yoshidome | 358/1.9 |
| 6,340,994 | B1 | * | 1/2002 | Margulis et al. | 348/625 |
| 6,351,320 | B1 | * | 2/2002 | Shin | 358/1.9 |
| 6,464,640 | B1 | * | 10/2002 | Guracar et al. | 600/453 |
| 6,541,921 | B1 | * | 4/2003 | Luciano et al. | 315/169.3 |
| 2001/0033260 | A1 | * | 10/2001 | Nishitani et al. | 345/87 |

* cited by examiner

*Primary Examiner*—Matthew C. Bella
*Assistant Examiner*—Wesner Sajous
(74) *Attorney, Agent, or Firm*—Beyer Weaver & Thomas, LLP

(57) ABSTRACT

An apparatus and method for allowing color adjustments in display devices is disclosed The apparatus comprises a multi-resolution structure for providing color adjustments; and an interpolator for interpolating at least one offset of the multi-resolution structure. An apparatus and method in accordance with the present invention uses a combination of color look-up tables with different levels of resolution, followed by interpolation to provide a display process which has high resolution but utilizes minimal memory. In so doing, memory is used for high-resolution areas only where needed. The multi-resolution structure is a very good approximation to the theoretical mapping table in the areas where it is needed. At the same time, since the high resolution areas are localized, a significant reduction in memory storage is possible.

17 Claims, 5 Drawing Sheets

10

APPARATUS AND METHOD FOR MULTI-RESOLUTION COLOR MAPPING FOR DISPLAY DEVICES

FIELD OF THE INVENTION

The present invention relates generally to digital display devices and particularly to an apparatus and method for multi-resolution color mapping for display devices.

BACKGROUND OF THE INVENTION

Video displays normally have color adjustment controls for hue and saturation. The hue control adjusts the tint and the saturation control adjusts the color richness of the display. These controls are global in the sense that they affect all the display pixels.

For applications such as skin tone adjustment, global color controls cannot be applied. These applications require local modification of a small subset of colors in the color space without affecting the other colors.

Local color modifications in display devices can be implemented by a mapping table that specifies an output color for every input color. This would be feasible if the set of all possible colors was reasonably small. However, a standard 24-bit RGB display device would need to map approximately 16 million different colors. The map, also known as a look-up table (LUT), would require 48 Mbytes of memory storage. Considering the cost of a 48 Mbyte lookup table implemented either in hardware or in software, this solution is not practical. Using a luma-chroma color space such as YUV, YPrPb etc. is a better solution because the colors are then represented by a subset of the components. The standard 8-bit resolution for U and V would require 128 Kbytes for the color map. This is still a very large memory for hardware implementations.

A more practical solution approximates the theoretical map by sampling the color space with a regular grid.

FIG. 1 is an example of a 4×4 sampling grid 10. The output values at the grid 10 intersections are stored in a table. A specific color will map to a unique coordinate within the grid. In general, the coordinate will not coincide with a grid vertex. An output value related to the coordinate is then calculated as an interpolation of the nearest output values, i.e. the values stored at the nearest grid vertices.

Sampling a space with a finer grid allows better control over the map because of the higher resolution, but at the cost of higher memory usage. A coarser grid saves memory at the expense of color resolution.

What is needed, therefore is a solution that approximates the theoretical mapping table as closely as possible without requiring an impractical amount of memory. Real-life applications such as skin tone adjustment concentrate on a small region of the full color space. Therefore high-resolution mapping is only required in a small subset of the color space. The present invention addresses such a need.

SUMMARY OF THE INVENTION

An apparatus and method for allowing color adjustments in display devices is disclosed The apparatus comprises a multi-resolution structure for providing color adjustments; and an interpolator for interpolating at least one offset of the multi-resolution structure.

An apparatus and method in accordance with the present invention uses a combination of color look-up tables with different levels of resolution, followed by interpolation to provide a display process which has high resolution but utilizes minimal memory.

In so doing, memory is used for high-resolution areas only where needed. The multi-resolution structure is a very good approximation to the theoretical mapping table in the areas where it is needed. At the same time, since the high resolution areas are localized, a significant reduction in memory storage is possible.

DETAILED DESCRIPTION

The present invention relates generally to digital display devices and particularly to an apparatus and method for multi-resolution color mapping for display devices. The following description is presented to enable one of ordinary skill in the art to make and use the invention and is provided in the context of a patent application and its requirements. Various modifications to the preferred embodiment and the generic principles and features described herein will be readily apparent to those skilled in the art. Thus, the present invention is not intended to be limited to the embodiment shown but is to be accorded the widest scope consistent with the principles and features described herein.

Definitions

Digital Display Device: An electronic image display device that uses digitized (sampled and quantized) image data. The input data itself may be analog in nature, and digitized within the device for final display on a digital display such as an LCD, OLED or plasma panel. Alternatively, the input data itself may be digital in nature and finally displayed on an analog display such as a CRT.

Pixel: The smallest discrete region on a digital display device that can be addressed for display.

Luma: The component of the input image data value that is correlated to the perceived intensity of the displayed data value.

Chroma: The component of the input image data value that is correlated to the perceived color of the displayed data value. In YUV color space, the chroma component is defined by the U and V data values.

An apparatus and method in accordance with the present invention uses a combination of color look-up tables with different levels of resolution, followed by interpolation to provide a display process which has high resolution but utilizes minimal memory.

In so doing, memory is used for high-resolution areas only where needed. The multi-resolution structure is a very good approximation to the theoretical mapping table in the areas where it is needed. At the same time, since the high resolution areas are localized, a significant reduction in memory storage is possible.

An apparatus utilized in accordance with the present invention may be a hardware implementation, a combination of hardware and software, or a software implementation. An example of a hardware solution would be an FPGA or ASIC design. An example of a hardware and software implementation would include a DSP implementation and embedded firmware implementation.

Please refer to the following for a more detailed description of the features of the present invention.

Apparatus

Figure 1:
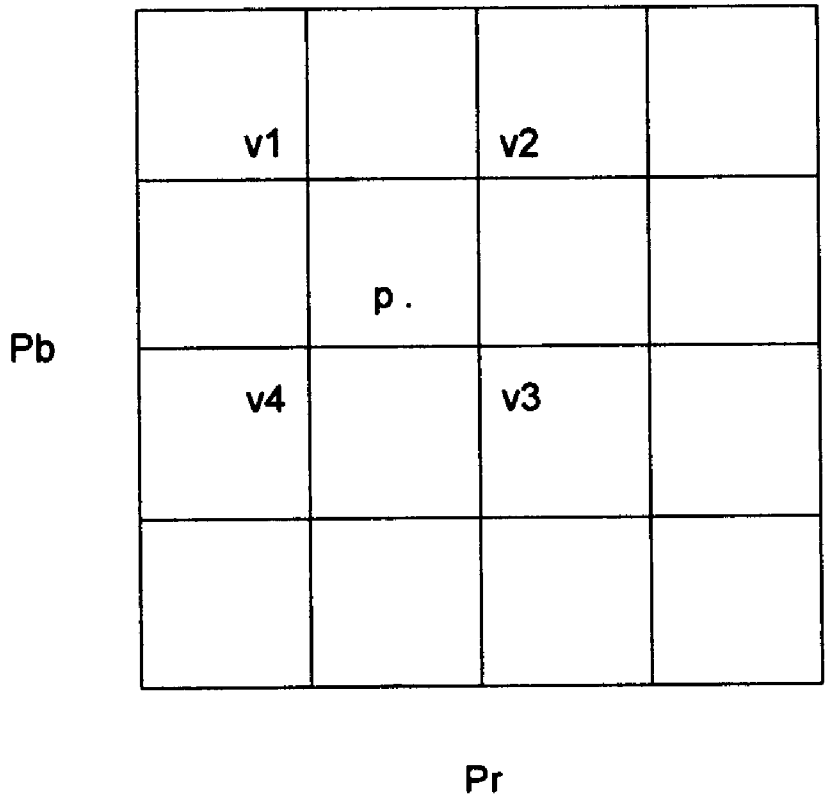
Prior Art Fig. 1
FIG. 1 is an example of a 4×4 sampling grid 10.
Figure 2:
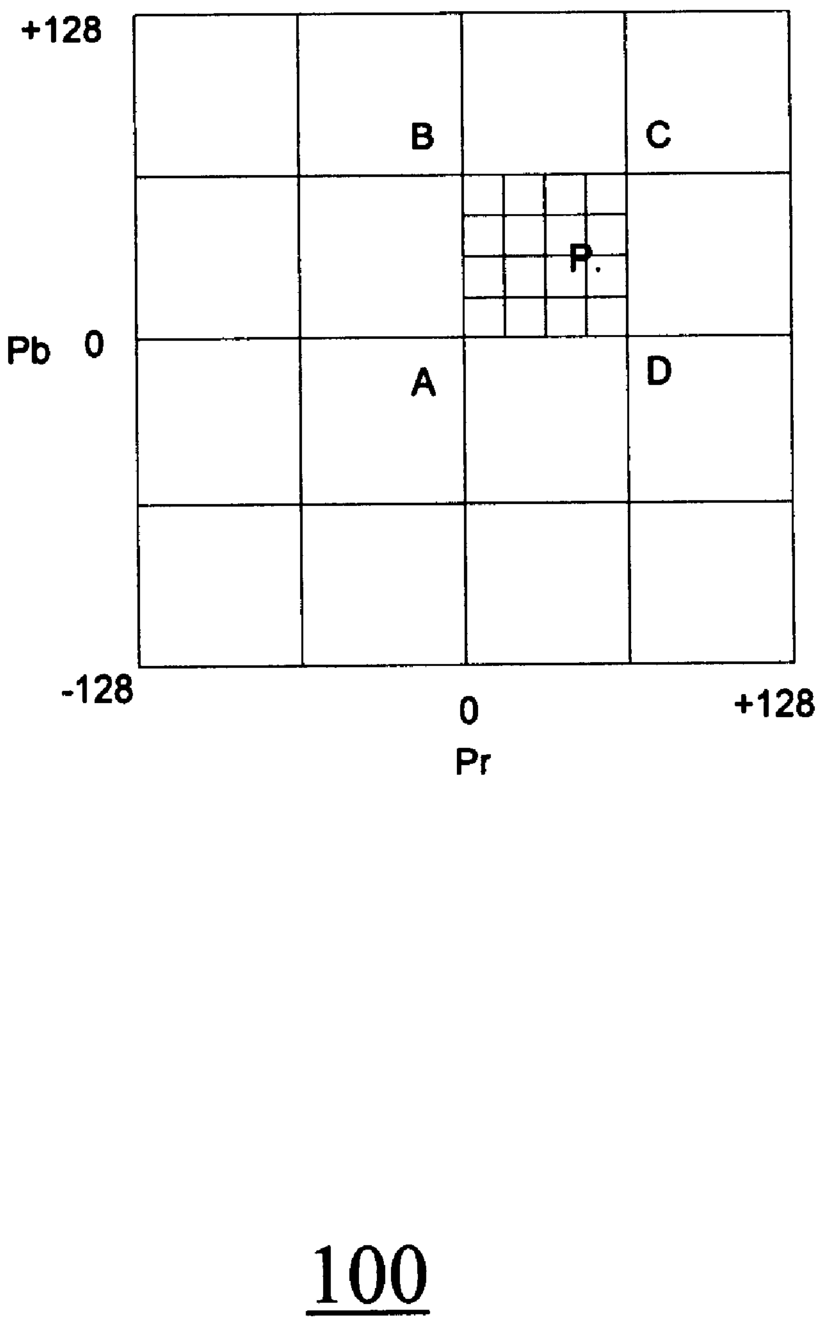
FIG. 2 illustrates a multi-resolution UV color structure in accordance with the present invention.
Figure 4:
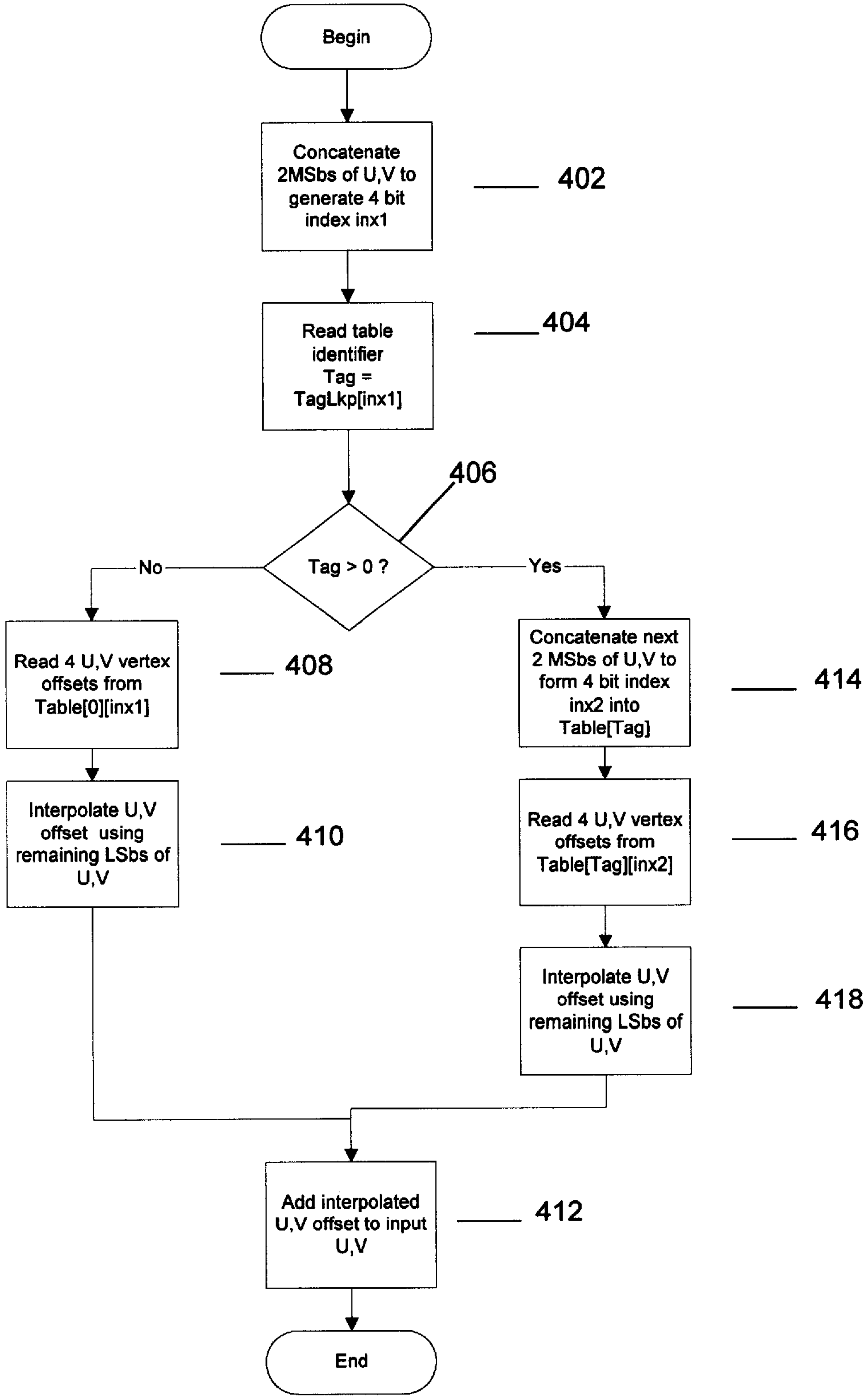
FIG. 4 is a flow chart which illustrates multi-resolution chroma mapping in an 8-bit UV space using two resolution levels.

FIG. 2 illustrates a multi-resolution UV color table 100 in accordance with the present invention. As is seen in this embodiment, a plurality of squares on the grid 200 are of one resolution, as illustrated by squares A, B, C and D, and at least one of the other squares is of another resolution as illustrated by FIG. 4. The apparatus for this invention is a set of data structures that can be implemented in hardware as memory and registers or in software as arrays. The primary data structure is used for storing the color LUT at different resolutions. The secondary data structures are used for indexing the final LUT to be applied.

The data input is a chroma value that is specified with two components—these may be defined as the UV components of a YUV representation for this description, but in general are any orthogonal representation of chroma. These components are digital values that are specified with a fixed precision, e.g. 8 bits or 10 bits. For the description that follows, we assume the following:

1. 8 bit UV color space
2. Two levels of resolution
3. One low-resolution table that divides the two-dimensional UV color space into 16 squares (4 subdivisions on each axis).
4. Multiple high-resolution tables further divide each low-resolution square into 16 sub-squares.
5. Each LUT entry is a data word containing the U and V color offsets for all 4 square vertices.

Assuming that the U,V offset is represented with No bits, one vertex chroma offset requires 2 No bits for storage. Storing all 4 vertex offsets for a square will require 4×2 No=8 No bits. One low-resolution table is required. If we specify Nh high-resolution tables, the multi-resolution table structure will then require a (Nh+1)×8 No memory structure for a hardware implementation.

The savings in memory for the same effective resolution is readily seen—dividing the UV color space into a 16×16 grid requires 16×16×8 No=2048 No bits. A multi-resolution hybrid table with a 4×4 low-resolution table and four 4×4 high-resolution tables requires (4+1)×8 No=40 No bits.

Figure 3:
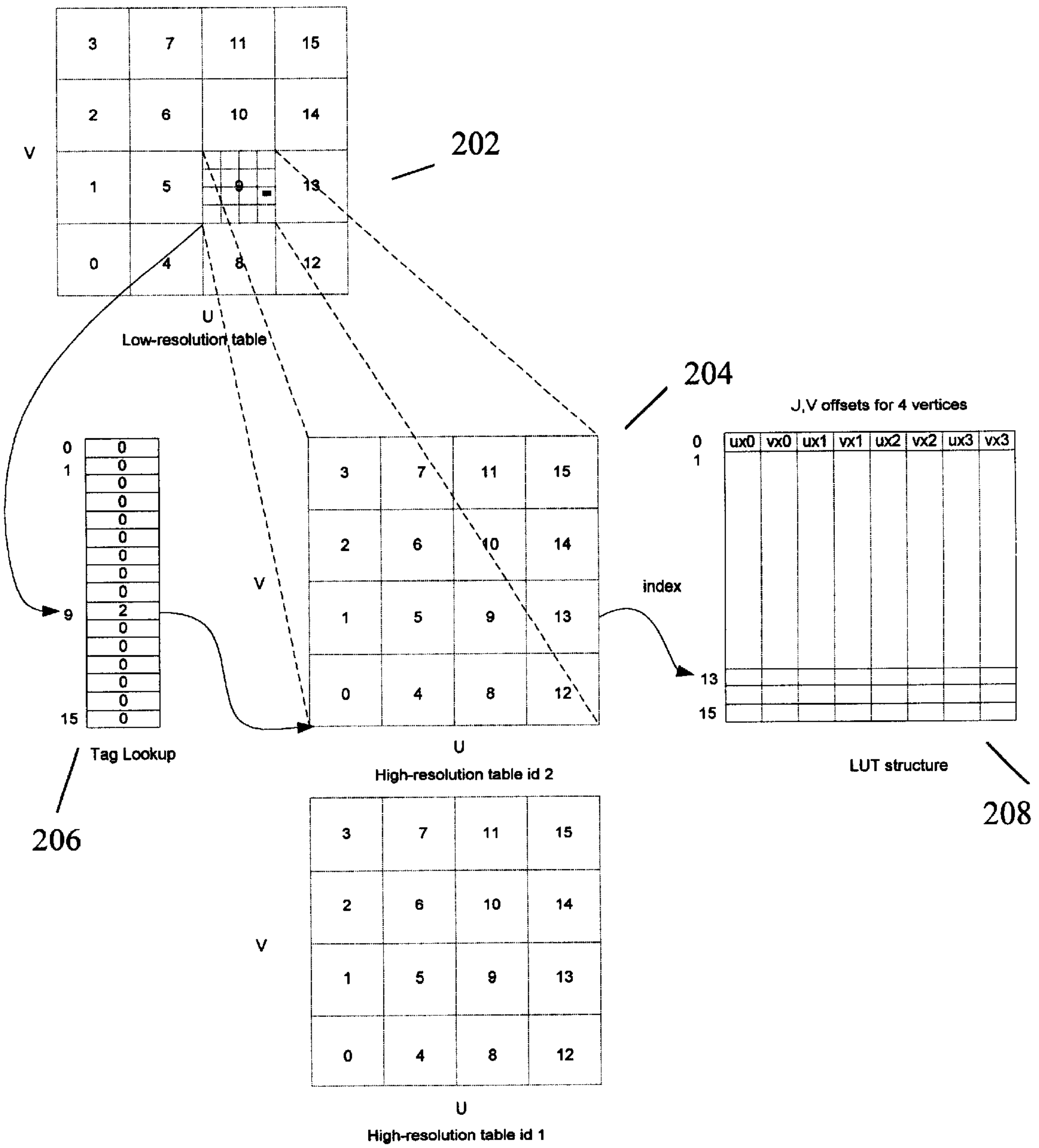
FIG. 3 illustrates a multi-resolution mapping system using a 2-levek, 8-bit UV color space.

FIG. 3 illustrates a multi-resolution mapping system 200 using a 2-level, 8-bit UV color space. As is seen, there is a low resolution table 202 and two high resolution tables 204. For a two-level resolution implementation, one secondary data structure 206, which is a one-dimensional tag table with 16 entries. The index to this table identifies a unique square in the low resolution table. A non-zero tag entry at this index specifies a unique high-resolution 204 table to be overlaid on this square in the low-resolution table. If it is zero, the low-resolution table 202 square is used for the color offset lookup and interpolation. If non-zero, the corresponding high-resolution table 204 is used for color offset lookup and interpolation. For the above example, an additional 16×3=48 bits of register storage would be required.

The low-resolution and high-resolution UV grids are conceptual representations only. The only data structures required are the chroma offset LUTs 208 and Tag Lookup table 206.

The location of an input pixel chroma value in UV space is shown as a black dot in square 9 in the low-resolution table. There are two high-resolution tables available with id 1 and 2 respectively. The high-resolution table with id 2 has been overlaid on square 9 of the low-resolution table, by specifying its id in the Tag Lookup table.

Method

FIG. 4 is a flow chart which illustrates multi-resolution chroma mapping in an 8-bit UV space using two resolution levels. The following description of the method applies to the above example with two-level resolution with a grid division of 4—however it can be easily extended to higher level resolution hierarchies and grid division factors.

Consider an input pixel that needs to be processed by the multi-resolution color map process. The chroma value is defined by the U and V components, which are 8 bit values.

Figure 5:
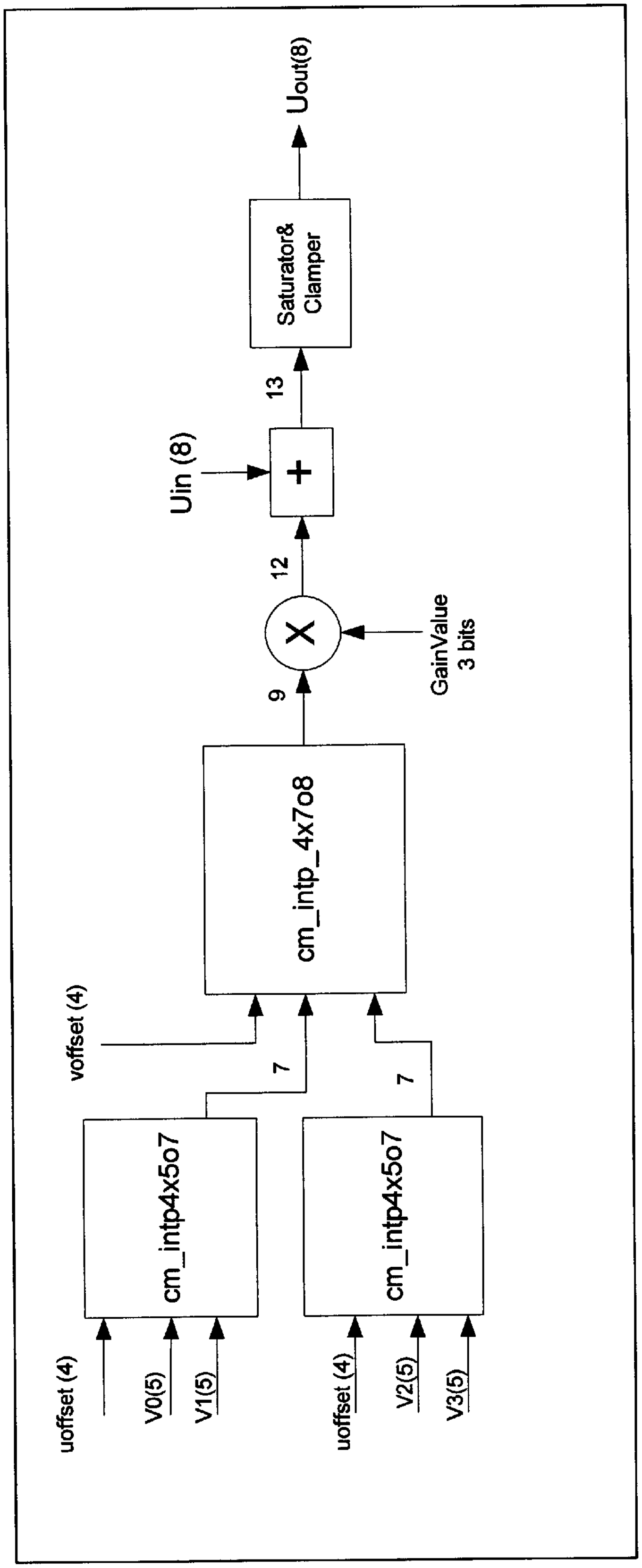
FIG. 5 is an example of a sample hardware implementation of bilinear interpolator for a two-dimensional look-up table.

1. Indexing: The 2 MSbs of U and V are concatenated to create a 4 bit index which uniquely identifies the coarse-resolution square in which this pixel chroma value lies (step 402).
2. Tag lookup: The index is used to read a tag from the Tag Lookup table. The tag value determines whether a high-resolution table has been overlaid on this particular coarse-resolution square, and if so, which table. If the tag is zero, the low-resolution table should be used. If the tag is non-zero, the value identifies which high-resolution table has been overlaid (step 404).
3. Low-resolution table interpolation: If the tag is zero, the remaining LSbs of U and V define the location of the input chroma value with respect to the four vertices of the surrounding low resolution square. The actual chroma offset to be applied is then determined by interpolation of the programmed chroma offsets stored at the four vertices using the U and V LSbs as the interpolation weights. The interpolated chroma offset is added to the input value to generate the output chroma value (steps 408 and 412).
4. High resolution table indexing: If the tag is non-zero, it uniquely identifies which fine-resolution table must be overlaid. The next 2 MSbs of U and V now are concatenated to form a 4 bit index which uniquely identifies the square in the high resolution table which encloses the input chroma value (steps 414 and 416).
5. High resolution table interpolation: Now the remaining 4 LSbs of U and V define the location of the input chroma value with respect to the surrounding fine resolution square vertices. The actual chroma offset to be applied is then determined by interpolation of the programmed chroma offsets stored at the four vertices, using the U and V LSbs as interpolation weights. The interpolated chroma offset is added to the input value to generate the output chroma value (steps 418 and 412). FIG. 5 is an example of a sample hardware implementation of bilinear interpolator for the two-dimensional look-up table.

The above process can be easily extended to higher levels of resolution hierarchy. For a three-level structure, we will need two tag tables in addition to the color LUTs. The MSbs are used to progressively index into the tag tables until either the tag entry is zero, or the highest resolution level has been reached. Then the remaining LSbs are used to interpolate the chroma offset from the surrounding 4 vertices. This offset is then added back to the original to generate the output chroma value.

The final table indexing process is very efficient as it only requires concatenation of chroma data MSbs followed by table lookups.

For hardware implementations, the storage of all 4 vertex offsets in one memory word, combined with the storage of the tag entries in a separate data structure, allows single cycle access to memory for the interpolation, irrespective of the resolution level. This also allows the color LUTs at all resolution levels to be stored in a single physical memory.

For a specific application, such as skin tone adjustment, the high resolution tables are overlaid only in the low resolution squares that contain skin tone chroma values. This user-definable localization of high resolution areas in the map provides a very good approximation to the theoretical full resolution color map in the area of interest, while keeping the overall memory requirements manageable.

The purpose of storing offsets instead of an absolute chroma component is to reduce the amount of memory storage required. This is possible because the amount of offset applied is relatively small in comparison to the chroma dynamic range and can therefore be represented with less bits.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A non-global, multi-resolution method of adjusting a chroma value of an input pixel, comprising:

identifying a location in a coarse resolution table corresponding to the input pixel chroma value;

identifying a high resolution table associated with the coarse resolution table location, if any, wherein the high resolution table is delineated by a number of high resolution table vertices;

defining a location of the input pixel chroma value with respect to the high resolution table vertices;

determining a pixel chroma value offset based upon the vertices; and generating an output pixel chroma value based upon the pixel chroma value offset and the input pixel chroma value.

2. A method as recited in claim 1, wherein the input pixel chroma value is defined by a first and a second components.

3. A method as recited in claim 2, wherein the first and the second components are a U component and a V component, respectively, in a YUV color space.

4. A method as recited in claim 3, wherein the first and the second components are each a fixed precision digital number each having a fixed number of bits.

5. A method as recited in claim 4, wherein the identifying comprises:

pointing to an entry in a tag lookup table based upon selected ones of the bits of each of the first and second components; and pointing to the high resolution table, if any, based upon the entry.

6. A method as recited in claim 5, wherein the defining a location is based upon other ones of the bits of each of the first and the second components.

7. A method as recited in claim 6, wherein the determining the pixel chroma value offset comprises interpolating pixel chroma value offsets at the vertices using the other ones of the bits as interpolation weights.

8. A method as recited in claim 7, if there is no high resolution table associated with the coarse resolution table location, then defining the location of the input pixel chroma value with respect to surrounding coarse resolution table vertices;

determining the pixel chroma value offset based upon the coarse resolution table vertices by interpolating the programmed chroma value offsets stored at the coarse resolution table vertices using the other ones of the bits as interpolation weights; and generating an output pixel chroma value by adding the pixel chroma value offset to the input pixel chroma value.

9. A method as recited in claim 1, wherein the multi-resolution color mapping can be utilized with RGB, YUV, YCrCB, YprPb color spaces.

10. A method as recited in claim 1, wherein the multi-resolution mapping can be utilized with analog or digital displays.

11. Computer program product for non-global, multi-resolution adjusting a chroma value of an input pixel, comprising:

computer code for identifying a location in a coarse resolution table corresponding to the input pixel chroma value;

computer code for identifying a high resolution table associated with the coarse resolution table location, if any, wherein the high resolution table is delineated by a number of high resolution table vertices;

computer code for defining a location of the input pixel chroma value with respect to the high resolution table vertices;

computer code for determining a pixel chroma value offset based upon the vertices;

computer code for generating an output pixel chroma value based upon the pixel chroma value offset and the input pixel chroma value; and computer readable medium for storing the computer code.

12. Computer program product as recited in claim 11, wherein the input pixel chroma value is defined by a first and a second component.

13. Computer program product as recited in claim 12, wherein the first and the second color components are each fixed precision digital numbers each having a fixed number of bits.

14. Computer program product as recited in claim 13, wherein the computer code for the identifying comprises:

pointing to an entry in a tag lookup table based upon selected ones of the bits of each of the first and second components; and pointing to the high resolution table, if any, based upon the entry.

15. Computer program product as recited in claim 14, wherein the defining a location is based upon other ones of the bits of each of the first and the second components.

16. Computer program product as recited in claim 15, wherein the determining the pixel chroma offset value comprises interpolating pixel chroma offset values at the vertices using the other ones of the bits as interpolation weights.

17. Computer program product as recited in claim 16, if there is no high resolution table associated with the coarse resolution table location, then defining the location of the input pixel chroma value with respect to surrounding coarse resolution table vertices;

determining the pixel chroma value offset based upon the coarse resolution table vertices by interpolating the programmed chroma offsets stored at the coarse resolution table vertices using the other ones of the bits as interpolation weights; and generating an output pixel chroma value by adding the pixel chroma value offset to the input pixel chroma value.

* * * * *